(12) United States Patent
DiGiovanni et al.

(10) Patent No.: US 9,771,497 B2
(45) Date of Patent: *Sep. 26, 2017

(54) METHODS OF FORMING EARTH-BORING TOOLS

(71) Applicants: Baker Hughes Incorporated, Houston, TX (US); Element Six Limited, County Claire (IE)

(72) Inventors: Anthony A. DiGiovanni, Houston, TX (US); Serdar Ozbayraktar, County Clare (IE); Kaveshini Naidoo, County Clare (IE)

(73) Assignees: Baker Hughes, a GE company, LLC, Houston, TX (US); Element Six Limited, County Claire (IE)

( * ) Notice: Subject to any disclaimer, the term of this patent is extended or adjusted under 35 U.S.C. 154(b) by 0 days.

This patent is subject to a terminal disclaimer.

(21) Appl. No.: 14/930,122

(22) Filed: Nov. 2, 2015

(65) Prior Publication Data

US 2016/0053549 A1 Feb. 25, 2016

Related U.S. Application Data

(63) Continuation of application No. 13/611,278, filed on Sep. 12, 2012, now Pat. No. 9,194,189.

(Continued)

(51) Int. Cl.
  *E21B 10/567* (2006.01)
  *C09G 1/02* (2006.01)
  (Continued)

(52) U.S. Cl.
  CPC .............. *C09G 1/02* (2013.01); *C09G 1/18* (2013.01); *C09K 3/1463* (2013.01); *H01L 21/30625* (2013.01); *H01L 21/31053* (2013.01)

(58) Field of Classification Search
  CPC .............. E21B 10/567; B24D 18/0009; B24D 99/0005
  See application file for complete search history.

(56) References Cited

U.S. PATENT DOCUMENTS 3,696,875 A 10/1972 Cortes
3,894,673 A 7/1975 Lowder et al.
(Continued)

FOREIGN PATENT DOCUMENTS

DE 3337240 A1 5/1985
EP 3116 A1 10/1982
(Continued)

OTHER PUBLICATIONS

International Search Report for International Application No. PCT/US2012/055843, dated Mar. 28, 2013, 3 pages.
(Continued)

*Primary Examiner* — Pegah Parvini
(74) *Attorney, Agent, or Firm* — TraskBritt

(57) ABSTRACT

A method of forming a cutting element for an earth-boring tool. The method includes providing diamond particles on a supporting substrate, the volume of diamond particles comprising a plurality of diamond nanoparticles. A catalyst-containing layer is provided on exposed surfaces of the volume of diamond nanoparticles and the supporting substrate. The diamond particles are processed under high temperature and high pressure conditions to form a sintered nanoparticle-enhanced polycrystalline compact. A cutting element and an earth-boring tool including a cutting element are also disclosed.

7 Claims, 6 Drawing Sheets

Related U.S. Application Data

(60) Provisional application No. 61/536,443, filed on Sep. 19, 2011.

(51) Int. Cl.
*H01L 21/3105* (2006.01)
*C09K 3/14* (2006.01)
*H01L 21/306* (2006.01)
*C09G 1/18* (2006.01)

(56) References Cited

U.S. PATENT DOCUMENTS

| | | |
|---|---|---|
| 3,949,263 A | 4/1976 | Harper |
| 4,018,576 A | 4/1977 | Lowder et al. |
| 4,156,329 A | 5/1979 | Daniels et al. |
| 4,225,322 A | 9/1980 | Knemeyer |
| 4,228,942 A | 10/1980 | Dietrich |
| 4,278,914 A | 7/1981 | Harper |
| 4,319,707 A | 3/1982 | Knemeyer |
| 4,340,650 A | 7/1982 | Pattanaik et al. |
| 4,359,112 A | 11/1982 | Garner et al. |
| 4,381,825 A | 5/1983 | Radtke |
| 4,539,018 A | 9/1985 | Whanger |
| 4,560,853 A | 12/1985 | Ziegel |
| 4,561,215 A | 12/1985 | Simshauser et al. |
| 4,593,776 A | 6/1986 | Salesky et al. |
| 4,649,992 A | 3/1987 | Geen et al. |
| 4,661,180 A | 4/1987 | Frushour |
| 4,676,124 A | 6/1987 | Fischer |
| 4,689,276 A | 8/1987 | Jacquez |
| 4,708,496 A | 11/1987 | McPherson |
| 4,724,913 A | 2/1988 | Morris |
| 4,732,364 A | 3/1988 | Seger et al. |
| 4,764,036 A | 8/1988 | McPherson |
| 4,766,040 A | 8/1988 | Hillert et al. |
| 4,767,050 A | 8/1988 | Flood et al. |
| 4,778,730 A | 10/1988 | Zucker |
| 4,883,500 A | 11/1989 | Deakins et al. |
| 4,884,476 A | 12/1989 | Okuzumi et al. |
| 4,894,917 A | 1/1990 | Nicolson |
| 4,908,046 A | 3/1990 | Wiand |
| 4,919,220 A | 4/1990 | Fuller et al. |
| 4,919,974 A | 4/1990 | McCune et al. |
| 4,931,069 A | 6/1990 | Wiand |
| 4,931,363 A | 6/1990 | Slutz et al. |
| 4,932,582 A | 6/1990 | Une |
| 4,943,488 A | 7/1990 | Sung et al. |
| 4,945,686 A | 8/1990 | Wiand |
| 4,993,505 A | 2/1991 | Packer et al. |
| 5,030,276 A | 7/1991 | Sung et al. |
| 5,049,164 A | 9/1991 | Horton et al. |
| 5,092,083 A | 3/1992 | Raffaelli |
| 5,100,045 A | 3/1992 | Wiand |
| 5,115,697 A | 5/1992 | Rodriguez et al. |
| 5,154,550 A | 10/1992 | Isobe et al. |
| 5,161,335 A | 11/1992 | Tank |
| 5,197,651 A | 3/1993 | Nakamura et al. |
| 5,199,832 A | 4/1993 | Meskin et al. |
| 5,213,171 A | 5/1993 | Clench et al. |
| 5,239,746 A | 8/1993 | Goldman |
| 5,259,148 A | 11/1993 | Wiand |
| 5,282,513 A | 2/1994 | Jones |
| 5,299,214 A | 3/1994 | Nakamura et al. |
| 5,317,839 A | 6/1994 | Anderson |
| 5,341,890 A | 8/1994 | Cawthorne et al. |
| 5,342,129 A | 8/1994 | Dennis et al. |
| 5,366,522 A | 11/1994 | Nakamura et al. |
| 5,370,299 A | 12/1994 | Tanabe et al. |
| 5,371,407 A | 12/1994 | Goldman |
| 5,379,853 A | 1/1995 | Lockwood et al. |
| 5,392,982 A | 2/1995 | Li |
| 5,413,689 A | 5/1995 | de Nora et al. |
| 5,429,199 A | 7/1995 | Sheirer et al. |
| 5,431,239 A | 7/1995 | Tibbitts et al. |
| 5,435,815 A | 7/1995 | Ikegaya et al. |
| 5,443,337 A | 8/1995 | Katayama |
| 5,453,041 A | 9/1995 | Oliver |
| 5,454,751 A | 10/1995 | Wiand et al. |
| 5,456,329 A | 10/1995 | Dennis et al. |
| 5,492,771 A | 2/1996 | Lowder et al. |
| 5,498,081 A | 3/1996 | Dennis et al. |
| 5,500,248 A | 3/1996 | Iacovangelo |
| 5,505,273 A | 4/1996 | Azar |
| 5,507,528 A | 4/1996 | Mastrosimone et al. |
| 5,516,027 A | 5/1996 | Tanabe et al. |
| 5,523,158 A | 6/1996 | Kapoor et al. |
| 5,529,805 A | 6/1996 | Iacovangelo et al. |
| 5,533,582 A | 7/1996 | Tibbitts |
| 5,547,121 A | 8/1996 | Kapoor et al. |
| 5,567,522 A | 10/1996 | Tanabe et al. |
| 5,567,525 A | 10/1996 | Kapoor et al. |
| 5,584,045 A | 12/1996 | Tanabe et al. |
| 5,596,813 A | 1/1997 | Olson et al. |
| 5,641,921 A | 6/1997 | Dennis et al. |
| 5,647,878 A | 7/1997 | Iacovangelo et al. |
| 5,653,376 A | 8/1997 | Nakamura et al. |
| 5,653,378 A | 8/1997 | Olson et al. |
| 5,656,045 A | 8/1997 | Wiand |
| 5,709,279 A | 1/1998 | Dennis |
| 5,738,698 A | 4/1998 | Kapoor et al. |
| 5,762,660 A | 6/1998 | Makowiecki et al. |
| 5,874,175 A | 2/1999 | Li |
| 5,951,378 A | 9/1999 | Miller et al. |
| 5,976,206 A | 11/1999 | Bligelow et al. |
| 6,042,463 A | 3/2000 | Johnson et al. |
| 6,044,920 A | 4/2000 | Massa et al. |
| 6,045,029 A | 4/2000 | Scott et al. |
| 6,054,693 A | 4/2000 | Barmatz et al. |
| 6,068,072 A | 5/2000 | Besson et al. |
| 6,105,694 A | 8/2000 | Scott |
| 6,109,918 A | 8/2000 | Hammond et al. |
| 6,129,145 A | 10/2000 | Yamamoto et al. |
| 6,155,755 A | 12/2000 | Kanada et al. |
| 6,193,593 B1 | 2/2001 | Miller et al. |
| 6,209,185 B1 | 4/2001 | Scott |
| 6,211,463 B1 | 4/2001 | Fabis |
| 6,213,380 B1 | 4/2001 | Collins et al. |
| 6,213,931 B1 | 4/2001 | Twardowski et al. |
| 6,216,805 B1 | 4/2001 | Lays et al. |
| 6,224,473 B1 | 5/2001 | Miller et al. |
| 6,234,261 B1 | 5/2001 | Evans et al. |
| 6,302,225 B1 | 10/2001 | Yoshida et al. |
| 6,325,709 B1 | 12/2001 | Nanda et al. |
| 6,350,184 B1 | 2/2002 | Holzapfel |
| 6,358,624 B1 | 3/2002 | Yoshida et al. |
| 6,368,198 B1 | 4/2002 | Sung et al. |
| 6,374,932 B1 | 4/2002 | Brady |
| 6,376,268 B1 | 4/2002 | Verdiell |
| 6,464,393 B2 | 10/2002 | Tatoh |
| 6,489,634 B1 | 12/2002 | Schaffer et al. |
| 6,511,700 B1 | 1/2003 | Airoldi et al. |
| 6,524,357 B2 | 2/2003 | Baldoni et al. |
| 6,528,159 B1 | 3/2003 | Kanada et al. |
| 6,575,350 B2 | 6/2003 | Evans et al. |
| 6,671,965 B2 | 1/2004 | Clemens et al. |
| 6,725,953 B2 | 4/2004 | Truax et al. |
| 6,868,755 B2 | 3/2005 | Yabuki et al. |
| 6,889,890 B2 | 5/2005 | Yamazaki et al. |
| 6,902,808 B2 | 6/2005 | Pinneo |
| 6,915,794 B2 | 7/2005 | Tommasini |
| 6,949,873 B2 | 9/2005 | Sung |
| 7,011,134 B2 | 3/2006 | Sung |
| 7,132,309 B2 | 11/2006 | Sung |
| 7,152,701 B2 | 12/2006 | Butland et al. |
| 7,331,845 B2 | 2/2008 | Imai et al. |
| 7,339,791 B2 | 3/2008 | Hoover et al. |
| 7,359,487 B1 | 4/2008 | Newcome |
| 7,396,086 B1 | 7/2008 | Hall et al. |
| 7,401,863 B1 | 7/2008 | Hall et al. |
| 7,407,012 B2 | 8/2008 | Keshavan et al. |
| 7,416,145 B2 | 8/2008 | Hall et al. |
| 7,487,849 B2 | 2/2009 | Radtke |
| 7,635,035 B1 | 12/2009 | Bertagnolli et al. |

(56) References Cited

U.S. PATENT DOCUMENTS

| | | |
|---|---|---|
| 9,194,189 B2 * | 11/2015 | DiGiovanni ........ E21B 10/567 |
| 2001/0002918 A1 | 6/2001 | Tatoh |
| 2001/0004946 A1 | 6/2001 | Jensen |
| 2001/0030067 A1 | 10/2001 | Evans et al. |
| 2001/0047891 A1 | 12/2001 | Truax et al. |
| 2002/0014041 A1 | 2/2002 | Baldoni et al. |
| 2002/0051848 A1 | 5/2002 | Li |
| 2002/0114963 A1 | 8/2002 | Petkie |
| 2002/0125048 A1 | 9/2002 | Traux et al. |
| 2002/0173252 A1 | 11/2002 | Li |
| 2003/0080177 A1 | 5/2003 | Yamazaki et al. |
| 2003/0106270 A1 | 6/2003 | Baldoni et al. |
| 2003/0118827 A1 | 6/2003 | Pinneo |
| 2003/0121159 A1 | 7/2003 | Clemens et al. |
| 2003/0121369 A1 | 7/2003 | Yabuki et al. |
| 2003/0155404 A1 | 8/2003 | Pinneo |
| 2003/0183368 A1 | 10/2003 | Paradis et al. |
| 2003/0211306 A1 | 11/2003 | Pinneo |
| 2004/0026983 A1 | 2/2004 | McAlvain |
| 2004/0031438 A1 | 2/2004 | Sung |
| 2004/0065484 A1 | 4/2004 | McAlvain |
| 2004/0066127 A1 | 4/2004 | Sung |
| 2004/0105237 A1 | 6/2004 | Hoover et al. |
| 2004/0107581 A1 | 6/2004 | Clemens |
| 2004/0112359 A1 | 6/2004 | Sung |
| 2004/0119161 A1 | 6/2004 | Saito et al. |
| 2004/0124231 A1 | 7/2004 | Hasz et al. |
| 2004/0134687 A1 | 7/2004 | Radford et al. |
| 2004/0152045 A1 | 8/2004 | Kachalon |
| 2004/0159471 A1 | 8/2004 | Azar et al. |
| 2004/0194967 A1 | 10/2004 | Jaensch |
| 2004/0238227 A1 | 12/2004 | Smith et al. |
| 2004/0246551 A1 | 12/2004 | Reijnen |
| 2004/0256624 A1 | 12/2004 | Sung |
| 2005/0077091 A1 | 4/2005 | Butland et al. |
| 2005/0252501 A1 | 11/2005 | Powell et al. |
| 2005/0260940 A1 | 11/2005 | Palushaj |
| 2005/0282358 A1 | 12/2005 | Di Cioccio et al. |
| 2006/0068358 A1 | 3/2006 | Lowder et al. |
| 2006/0157285 A1 | 7/2006 | Cannon et al. |
| 2006/0174823 A1 | 8/2006 | Sung |
| 2006/0191723 A1 | 8/2006 | Keshavan |
| 2006/0247769 A1 | 11/2006 | Molz et al. |
| 2006/0254830 A1 | 11/2006 | Radtke |
| 2006/0266558 A1 | 11/2006 | Middlemiss et al. |
| 2006/0272571 A1 | 12/2006 | Cho |
| 2006/0278441 A1 | 12/2006 | Cooley et al. |
| 2007/0023206 A1 | 2/2007 | Keshavan |
| 2007/0034147 A1 | 2/2007 | Wort et al. |
| 2007/0034416 A1 | 2/2007 | Cho et al. |
| 2007/0099549 A1 | 5/2007 | Palushaj |
| 2007/0128986 A1 | 6/2007 | Imai et al. |
| 2007/0151554 A1 | 7/2007 | Song et al. |
| 2007/0157469 A1 | 7/2007 | Schulz-Harder |
| 2007/0157670 A1 | 7/2007 | Sung |
| 2007/0198096 A1 | 8/2007 | Wort |
| 2007/0205023 A1 | 9/2007 | Hoffmaster et al. |
| 2007/0215390 A1 | 9/2007 | Azar et al. |
| 2007/0221406 A1 | 9/2007 | Hall et al. |
| 2008/0011522 A1 | 1/2008 | Hall et al. |
| 2008/0029312 A1 | 2/2008 | Hall et al. |
| 2008/0035388 A1 | 2/2008 | Hall et al. |
| 2008/0036269 A1 | 2/2008 | Hall et al. |
| 2008/0041992 A1 | 2/2008 | Hall et al. |
| 2008/0085407 A1 | 4/2008 | Cooley et al. |
| 2008/0106139 A1 | 5/2008 | Hall et al. |
| 2008/0110638 A1 | 5/2008 | Hall et al. |
| 2008/0135660 A1 | 6/2008 | Hall et al. |
| 2008/0142276 A1 | 6/2008 | Griffo et al. |
| 2008/0145528 A1 | 6/2008 | Deng et al. |
| 2008/0160886 A1 | 7/2008 | Palushaj |
| 2008/0176494 A1 | 7/2008 | Palushaj |
| 2008/0206576 A1 | 8/2008 | Qian et al. |
| 2008/0230278 A9 | 9/2008 | Hoffmaster et al. |
| 2009/0078470 A1 | 3/2009 | Lyons et al. |
| 2009/0090563 A1 | 4/2009 | Voronin et al. |
| 2009/0152018 A1 | 6/2009 | Sani |
| 2010/0186304 A1 | 7/2010 | Burgess et al. |
| 2011/0023375 A1 | 2/2011 | Sani et al. |
| 2011/0031033 A1 * | 2/2011 | Mourik ................. C22C 26/00 |
| | | 175/428 |
| 2011/0073380 A1 | 3/2011 | DiGiovanni |
| 2011/0088954 A1 | 4/2011 | DiGiovanni et al. |
| 2013/0068535 A1 | 3/2013 | DiGiovanni |

FOREIGN PATENT DOCUMENTS

| | | |
|---|---|---|
| EP | 213434 A1 | 3/1987 |
| EP | 117241 A1 | 5/1987 |
| EP | 117241 B1 | 5/1987 |
| EP | 140600 A2 | 8/1988 |
| EP | 140600 B1 | 8/1988 |
| EP | 290839 A2 | 11/1988 |
| EP | 337685 A2 | 10/1989 |
| EP | 365843 A1 | 5/1990 |
| EP | 238938 A1 | 7/1990 |
| EP | 238938 B1 | 7/1990 |
| EP | 297071 A1 | 3/1992 |
| EP | 297071 B1 | 3/1992 |
| EP | 319926 A2 | 7/1992 |
| EP | 319926 B1 | 7/1992 |
| EP | 244947 B1 | 12/1992 |
| EP | 534729 A2 | 3/1993 |
| EP | 560287 A1 | 9/1993 |
| EP | 413543 A2 | 10/1993 |
| EP | 413543 B1 | 10/1993 |
| EP | 351952 A2 | 4/1994 |
| EP | 351952 B1 | 4/1994 |
| EP | 458434 A2 | 9/1994 |
| EP | 619382 A1 | 10/1994 |
| EP | 378378 A1 | 1/1995 |
| EP | 378378 B1 | 1/1995 |
| EP | 477585 B1 | 1/1995 |
| EP | 435423 A2 | 3/1995 |
| EP | 435423 B1 | 3/1995 |
| EP | 328583 B1 | 8/1995 |
| EP | 443517 A2 | 9/1995 |
| EP | 443517 B1 | 9/1995 |
| EP | 517264 A1 | 9/1995 |
| EP | 517264 B1 | 9/1995 |
| EP | 439017 A1 | 12/1995 |
| EP | 439017 B1 | 12/1995 |
| EP | 534370 A1 | 5/1996 |
| EP | 534370 B1 | 5/1996 |
| EP | 567124 B1 | 9/1997 |
| EP | 541400 A2 | 3/1998 |
| EP | 932199 A2 | 7/1999 |
| EP | 953652 A1 | 11/1999 |
| EP | 694510 A2 | 4/2000 |
| EP | 694510 B1 | 4/2000 |
| EP | 932199 A3 | 8/2000 |
| EP | 521405 A1 | 4/2001 |
| EP | 521405 B1 | 4/2001 |
| EP | 811082 B1 | 5/2001 |
| EP | 541071 A1 | 10/2001 |
| EP | 541071 B1 | 10/2001 |
| EP | 807693 B1 | 10/2001 |
| EP | 1151825 A2 | 11/2001 |
| EP | 1170460 A2 | 1/2002 |
| EP | 718462 B1 | 4/2002 |
| EP | 577066 A1 | 9/2002 |
| EP | 577066 B1 | 9/2002 |
| EP | 931782 A1 | 9/2002 |
| EP | 931782 B1 | 9/2002 |
| EP | 1036913 A1 | 10/2002 |
| EP | 1036913 B1 | 10/2002 |
| EP | 1053984 A2 | 2/2003 |
| EP | 1053984 A3 | 2/2003 |
| EP | 1053984 B1 | 2/2003 |
| EP | 1302273 A2 | 4/2003 |
| EP | 1314505 A1 | 5/2003 |
| EP | 1323502 A2 | 7/2003 |
| EP | 918134 A1 | 6/2004 |
| EP | 918134 B1 | 6/2004 |

(56) References Cited

FOREIGN PATENT DOCUMENTS

| | | |
|---|---|---|
| EP | 1323502 A3 | 6/2004 |
| EP | 1432029 A2 | 6/2004 |
| EP | 1302273 A3 | 7/2004 |
| EP | 1432029 A3 | 8/2004 |
| EP | 1079063 A1 | 9/2004 |
| EP | 1452685 A2 | 9/2004 |
| EP | 940215 A1 | 1/2005 |
| EP | 940215 B1 | 1/2005 |
| EP | 1452685 A3 | 3/2005 |
| EP | 1516942 A1 | 3/2005 |
| EP | 1151825 B1 | 6/2006 |
| EP | 1430007 B1 | 9/2006 |
| EP | 1302273 B1 | 3/2008 |
| EP | 1323502 B1 | 10/2008 |
| EP | 1976004 A1 | 10/2008 |
| GB | 1310686 A | 3/1973 |
| GB | 1310883 A | 3/1973 |
| GB | 1462510 A | 1/1977 |
| GB | 1489130 A | 10/1977 |
| GB | 2169687 A | 7/1986 |
| GB | 2209483 A | 5/1989 |
| GB | 2211856 A | 7/1989 |
| GB | 2213414 A | 8/1989 |
| GB | 2224225 A | 5/1990 |
| GB | 2259263 A | 3/1993 |
| GB | 2267733 A | 12/1993 |
| GB | 2268768 A | 1/1994 |
| GB | 2276896 A | 10/1994 |
| GB | 2285823 A | 7/1995 |
| GB | 2287897 A | 10/1995 |
| GB | 2298665 A | 9/1996 |
| GB | 2339713 A | 2/2000 |
| GB | 2353053 A | 2/2001 |
| GB | 2353545 A | 2/2001 |
| GB | 2398316 A | 8/2004 |
| GB | 2404405 A | 2/2005 |
| GB | 2404406 A | 2/2005 |
| GB | 2405424 A | 3/2005 |
| GB | 2420139 A | 5/2006 |
| GB | 2424433 A | 9/2006 |
| GB | 2426223 A | 11/2006 |
| GB | 2429727 A | 3/2007 |
| GB | 2438073 A | 11/2007 |
| GB | 2453135 A | 4/2009 |
| GB | 2453663 A | 4/2009 |
| JP | 56088325 A | 7/1981 |
| JP | 59156669 A | 9/1984 |
| JP | 60187603 A | 9/1985 |
| JP | 61135121 A | 6/1986 |
| JP | 62139865 A | 6/1987 |
| JP | 63024002 A | 2/1988 |
| JP | 63300803 A | 12/1988 |
| JP | 01096073 A | 4/1989 |
| JP | 01225774 A | 9/1989 |
| JP | 01275746 A | 11/1989 |
| JP | 02137679 A | 5/1990 |
| JP | 02274405 A | 11/1990 |
| JP | 03033095 A | 2/1991 |
| JP | 03198360 A | 8/1991 |
| JP | 03221374 A | 9/1991 |
| JP | 04096340 A | 3/1992 |
| JP | 04331798 A | 11/1992 |
| JP | 05139890 A | 6/1993 |
| JP | 05140769 A | 6/1993 |
| JP | 05228624 A | 9/1993 |
| JP | 05299478 A | 11/1993 |
| JP | 06016498 A | 1/1994 |
| JP | 06047531 A | 2/1994 |
| JP | 06205857 A | 7/1994 |
| JP | 07138093 A | 5/1995 |
| JP | 08039361 A | 2/1996 |
| JP | 08039362 A | 2/1996 |
| JP | 09201705 A | 8/1997 |
| JP | 10118914 A | 5/1998 |
| JP | 10202530 A | 8/1998 |
| JP | 10242221 A | 9/1998 |
| JP | 10340934 A | 12/1998 |
| JP | 11008274 A | 1/1999 |
| JP | 11045915 A | 2/1999 |
| JP | 1168037 A | 6/1999 |
| JP | 200024932 A | 1/2000 |
| JP | 2000178082 A | 6/2000 |
| JP | 2001127375 A | 5/2001 |
| JP | 2001192801 A | 7/2001 |
| JP | 2001210613 A | 8/2001 |
| JP | 2002154058 A | 5/2002 |
| JP | 2002169539 A | 6/2002 |
| JP | 2002263831 A | 9/2002 |
| JP | 2003117682 A | 4/2003 |
| JP | 2003165056 A | 6/2003 |
| JP | 2003205479 A | 7/2003 |
| JP | 2004188518 A | 7/2004 |
| JP | 2004291126 A | 10/2004 |
| JP | 2005325417 A | 11/2005 |
| JP | 2008093772 A | 4/2008 |
| JP | 2008128924 A | 6/2008 |
| WO | 8707342 A1 | 12/1987 |
| WO | 8801702 A1 | 3/1988 |
| WO | 8809826 A1 | 12/1988 |
| WO | 9201092 A1 | 1/1992 |
| WO | 9302823 A1 | 2/1993 |
| WO | 9325494 A1 | 12/1993 |
| WO | 9610466 A1 | 8/1996 |
| WO | 9626303 A1 | 8/1996 |
| WO | 9705757 A1 | 2/1997 |
| WO | 9806564 A1 | 2/1998 |
| WO | 9845091 A2 | 10/1998 |
| WO | 9904128 A2 | 1/1999 |
| WO | 9928084 A1 | 6/1999 |
| WO | 9929465 A1 | 6/1999 |
| WO | 9935694 A2 | 7/1999 |
| WO | 0034001 A1 | 6/2000 |
| WO | 0106051 A1 | 3/2001 |
| WO | 0126153 A1 | 4/2001 |
| WO | 0136711 A1 | 5/2001 |
| WO | 0161399 A1 | 8/2001 |
| WO | 0202844 A2 | 1/2002 |
| WO | 0207183 A1 | 1/2002 |
| WO | 02058143 A2 | 7/2002 |
| WO | 03027043 A1 | 4/2003 |
| WO | 2005010245 A1 | 2/2005 |
| WO | 2005027799 A1 | 3/2005 |
| WO | 2005075142 A1 | 8/2005 |
| WO | 2005084879 A1 | 9/2005 |
| WO | 2005113198 A2 | 12/2005 |
| WO | 2005122284 A2 | 12/2005 |
| WO | 2005122284 A3 | 8/2006 |
| WO | 2006116214 A1 | 11/2006 |
| WO | 2007007126 A1 | 1/2007 |
| WO | 2007074720 A1 | 7/2007 |
| WO | 2008086280 A1 | 7/2008 |
| WO | 2008087610 A1 | 7/2008 |
| WO | 2008088908 A1 | 7/2008 |
| WO | 2009010934 A2 | 1/2009 |
| WO | 2009013716 A2 | 1/2009 |
| WO | 2009044488 A1 | 4/2009 |

OTHER PUBLICATIONS

International Written Opinion for International Application No. PCT/US2012/055843, dated Mar. 19, 2014, 6 pages.

International Preliminary Report on Patentability for International Application No. PCT/US2012/055843, dated Mar. 25, 2014, 7 pages.

* cited by examiner

METHODS OF FORMING EARTH-BORING TOOLS

CROSS-REFERENCE TO RELATED APPLICATIONS

This application is a continuation of U.S. patent application Ser. No. 13/611,278, filed Sep. 12, 2012, now U.S. Pat. No. 9,194,189, issued Nov. 24, 2015. This application also claims the benefit of U.S. Provisional Patent Application Ser. No. 61/536,443, filed Sep. 19, 2011, the disclosure of each of which is hereby incorporated herein in its entirety by this reference.

TECHNICAL FIELD

Embodiments of the disclosure relate to methods of forming a cutting element for an earth-boring tool, to a related cutting element, and to an earth-boring tool including such a cutting element.

BACKGROUND

Earth-boring tools for forming wellbores in subterranean earth formations may include a plurality of cutting elements secured to a body. For example, fixed-cutter earth-boring rotary drill bits ("drag bits") include a plurality of cutting elements that are fixedly attached to a bit body of the drill bit. Similarly, roller cone earth-boring rotary drill bits may include cones that are mounted on bearing pins extending from legs of a bit body such that each cone is capable of rotating about the bearing pin on which it is mounted. A plurality of cutting elements may be mounted to each cone of the drill bit.

The cutting elements used in such earth-boring tools often include polycrystalline diamond compacts ("PDC"), which act as cutting faces of a polycrystalline diamond ("PCD") material. PCD material is material that includes inter-bonded grains or crystals of diamond material. In other words, PCD material includes direct, inter-granular bonds between the grains or crystals of diamond material. The terms "grain" and "crystal" are used synonymously and interchangeably herein.

PDC cutting elements are generally formed by sintering and bonding together relatively small diamond (synthetic, natural or a combination) grains, termed "grit," under conditions of high temperature and high pressure in the presence of a catalyst (e.g., cobalt, iron, nickel, or alloys and mixtures thereof) to form a layer (e.g., a compact or "table") of PCD material. These processes are often referred to as high temperature/high pressure (or "HTHP") processes. The supporting substrate may comprise a cermet material (i.e., a ceramic-metal composite material) such as, for example, cobalt-cemented tungsten carbide. In some instances, the PCD material may be formed on the cutting element, for example, during the HTHP process. In such instances, catalyst material (e.g., cobalt) in the supporting substrate may be "swept" into the diamond grains during sintering and serve as a catalyst material for forming the diamond table from the diamond grains. Powdered catalyst material may also be mixed with the diamond grains prior to sintering the grains together in an HTHP process.

Upon formation of the diamond table using an HTHP process, catalyst material may remain in interstitial spaces between the inter-bonded grains of the PDC. The presence of the catalyst material in the PDC may contribute to thermal damage in the PDC when the PDC cutting element is heated during use due to friction at the contact point between the cutting element and the formation. Accordingly, the catalyst material (e.g., cobalt) may be leached out of the interstitial spaces using, for example, an acid or combination of acids (e.g., aqua regia). Substantially all of the catalyst material may be removed from the PDC, or catalyst material may be removed from only a portion thereof, for example, from a cutting face of the PDC, from a side of the PDC, or both, to a desired depth. However, a fully leached PDC is relatively more brittle and vulnerable to shear, compressive, and tensile stresses than is a non-leached PDC. In addition, it is difficult to secure a completely leached PDC to a supporting substrate.

To improve the thermal stability, the mechanical durability, and bonding characteristics of the PDC, nanoparticles (e.g., particles having an average particle diameter of about 500 nm or less) may be provided in the interstitial spaces of the PDC. However, disadvantageously, as higher concentrations of nanoparticles are incorporated into the interstitial spaces the "sweep" of catalyst material from the supporting substrate during subsequent HTHP processing is inhibited, resulting in a the formation of a nanoparticle-enhanced ("nanoparticle-enhanced") PDC that may be poorly sintered at positions distal from an interface of the nanoparticle-enhanced PDC and the supporting substrate.

BRIEF SUMMARY

In some embodiments, the disclosure includes a method of forming a cutting element for an earth-boring tool. Diamond particles may be provided on a supporting substrate, the volume of diamond particles comprising a plurality of diamond nanoparticles. A catalyst-containing layer may be provided on exposed surfaces of the volume of diamond nanoparticles and the supporting substrate. The diamond particles may be processed under high temperature and high pressure conditions to form a sintered nanoparticle-enhanced polycrystalline compact.

In additional embodiments, the disclosure includes a cutting element for use in an earth-boring tool. The cutting element may comprise a sintered nanoparticle-enhanced polycrystalline compact formed by a method comprising providing a volume of diamond particles on a supporting substrate, the volume of diamond particles comprising a plurality of diamond nanoparticles. The diamond particles may be processed under high temperature and high pressure conditions to form a sintered nanoparticle-enhanced polycrystalline compact. The diamond particles may be processed under high temperature and high pressure conditions to form the sintered nanoparticle-enhanced polycrystalline compact.

In yet additional embodiments, the disclosure includes an earth-boring tool comprising a cutting element. The cutting element may comprise a sintered nanoparticle-enhanced polycrystalline compact formed by a method comprising providing a volume of diamond particles on a supporting substrate, the volume of diamond particles comprising a plurality of diamond nanoparticles. The diamond particles may be processed under high temperature and high pressure conditions to form a sintered nanoparticle-enhanced polycrystalline compact. The diamond particles may be processed under high temperature and high pressure conditions to form the sintered nanoparticle-enhanced polycrystalline compact.

DETAILED DESCRIPTION

The illustrations presented herein are, in some instances, not actual views of any particular cutting element insert, cutting element, drill bit, system or method, but are merely idealized representations which are employed to describe embodiments of the disclosure. Additionally, elements common between figures may retain the same numerical designation.

Embodiments of the disclosure include methods for forming a cutting element including a nanoparticle-enhanced polycrystalline compact, such as a nanoparticle-enhanced polycrystalline diamond compact ("PDC"), along with related cutting elements, and earth-boring tools including such cutting elements. The methods of the disclosure utilize at least one catalyst material to form the polycrystalline compact.

As used herein, the term "inter-granular bond" means and includes any direct atomic bond (e.g., covalent, metallic, etc.) between atoms in adjacent grains of hard material.

As used herein, the term "nanoparticle" means and includes any particle having an average particle diameter of about 500 nm or less. Nanoparticles include grains in a polycrystalline material having an average grain size of about 500 nm or less.

As used herein, the term "polycrystalline material" means and includes any material comprising a plurality of grains or crystals of the material that are bonded directly together by inter-granular bonds. The crystal structures of the individual grains of the material may be randomly oriented in space within the polycrystalline material.

As used herein, the term "nanoparticle-enhanced polycrystalline compact" means and includes any structure including a polycrystalline material and plurality of nanoparticles, wherein the polycrystalline material is formed by a process that involves application of pressure (e.g., compression) to a precursor material or materials used to form the polycrystalline material.

As used herein, the term "catalyst material" refers to any material that is capable of substantially catalyzing the formation of inter-granular bonds between grains of hard material during an HTHP but at least contributes to the degradation of the inter-granular bonds and granular material under elevated temperatures, pressures, and other conditions that may be encountered in a drilling operation for forming a wellbore in a subterranean formation. For example, catalyst materials for diamond include cobalt, iron, nickel, other elements from Group VIIIA of the Periodic Table of the Elements, and alloys thereof.

As used herein, the term "hard material" means and includes any material having a Knoop hardness value of about 3,000 $Kg_f/mm^2$ (29,420 MPa) or more. Hard materials include, for example, diamond and cubic boron nitride.

Figure 1:
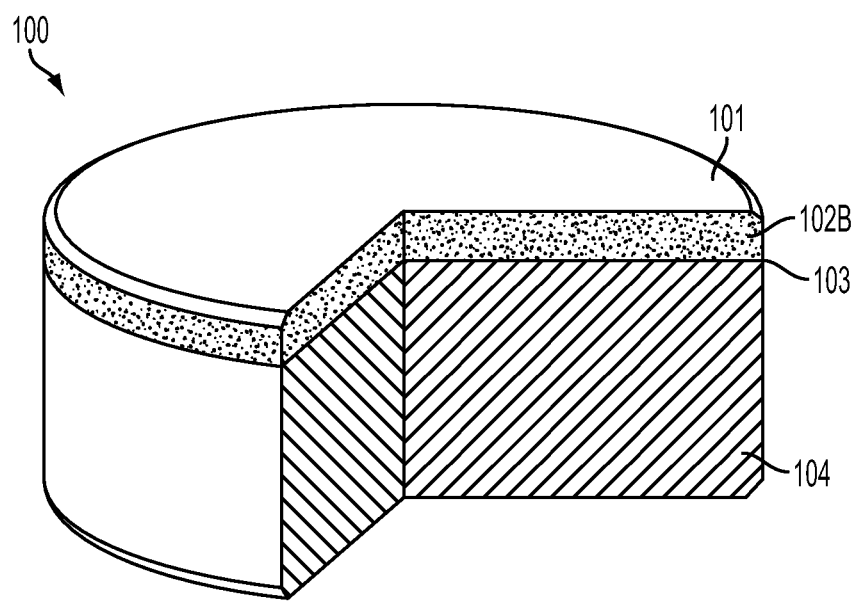
FIG. 1 is a partial cut-away perspective view of an embodiment of a cutting element for an earth-boring tool, in accordance with an embodiment of the disclosure.
Figure 4:
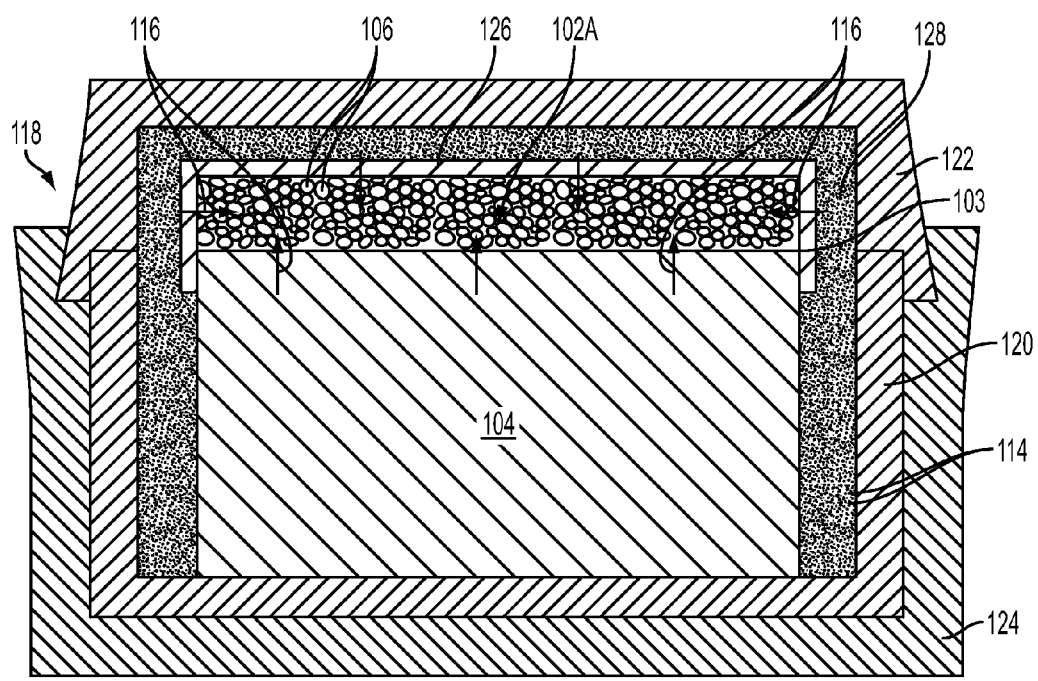
FIG. 4 is a simplified cross-sectional view of a configuration that may be used in a method of forming the cutting element of FIG. 1, in accordance with another embodiment of the disclosure.

FIG. 1 illustrates a cutting element 100, which may be formed in accordance with embodiments of methods as disclosed herein. The cutting element 100 includes a sintered nanoparticle-enhanced polycrystalline compact 102B bonded to supporting substrate 104 at an interface 103. The sintered nanoparticle-enhanced polycrystalline compact 102B includes a cutting surface 101. Although the cutting element 100 in the embodiment depicted in FIG. 4 is cylindrical or disc-shaped, in other embodiments, the cutting element 100 may have any desirable shape, such as a dome, cone, or chisel.

Figure 2:
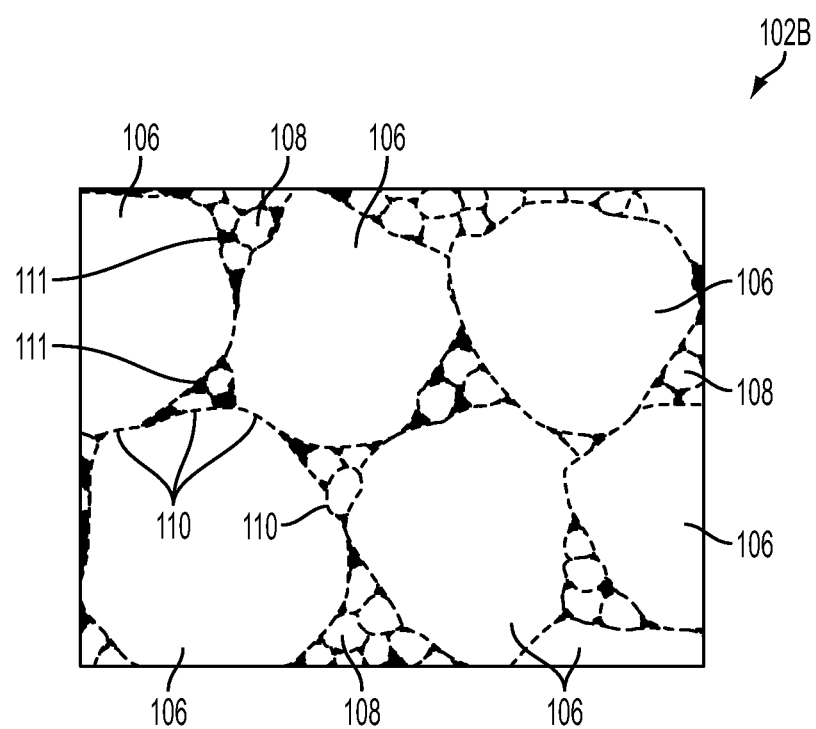
FIG. 2 is a simplified cross-sectional view illustrating how a microstructure of the sintered nanoparticle-enhanced polycrystalline compact of the cutting element of FIG. 1 may appear under magnification.

Referring to FIG. 2, the sintered nanoparticle-enhanced polycrystalline compact 102B may include interspersed and inter-bonded grains that form a three-dimensional network of polycrystalline material. The grains of the sintered nanoparticle-enhanced polycrystalline compact 102B may have a multimodal grain size distribution. For example, the sintered nanoparticle-enhanced polycrystalline compact 102B may include larger grains 106 and smaller grains 108. Direct inter-granular bonds between the larger grains 106 and the smaller grains 108 are represented in FIG. 2 by dashed lines 110.

The larger grains 106 may be formed of and include a hard material (e.g., diamond, boron nitride, silicon nitride, silicon carbide, titanium carbide, tungsten carbide, tantalum carbide). The larger grains 106 may be monodisperse, wherein all the larger grains 106 are of substantially the same size, or may be polydisperse, wherein the larger grains 106 have a range of sizes and are averaged. The smaller grains 108 may be nanoparticles formed of and including at least one of hard material (e.g., diamond, boron nitride, silicon nitride, silicon carbide, titanium carbide, tungsten carbide, tantalum carbide) and non-hard material (e.g., carbides, ceramics, oxides, intermetallics, clays, minerals, glasses, elemental constituents, and various forms of carbon, such as carbon nanotubes, fullerenes, adamantanes, graphene, and amorphous carbon). The smaller grains 108 may be monodisperse, wherein all the smaller grains 108 are of substantially the same size, or may be polydisperse, wherein the smaller grains 108 have a range of sizes and are averaged. The sintered nanoparticle-enhanced polycrystalline compact 102B may include from about 0.01% to about 99% by volume or weight smaller grains 108, such as from about 0.01% to about 50% by volume smaller grains 108, or from 0.1% to about 10% by weight smaller grains 108.

Interstitial spaces 111 (shaded black in FIG. 2) are present between the inter-bonded larger grains 106 and smaller grains 108 of the sintered nanoparticle-enhanced polycrystalline compact 102B. The interstitial spaces 111 may be at least partially filled with a solid material, such as at least one of a catalyst material (e.g., iron, cobalt, nickel, or an alloy thereof) and a carbon-free material. In at least some embodiments, the solid material of the interstitial spaces 111 may vary throughout a thickness of the sintered nanoparticle-enhanced polycrystalline compact 102B. For example, the interstitial spaces 111 proximate the interface 103 (FIG. 1) of the supporting substrate 104 (FIG. 1) and the sintered nanoparticle-enhanced polycrystalline compact 102B may be filled with a first solid material (e.g., a catalyst material, such as cobalt) and the interstitial spaces 111 proximate exposed surfaces of the polycrystalline compact 102, such as the cutting surface 101 (FIG. 1), may be filled with a second solid material (e.g., another catalyst material, such as nickel). At least some of the interstitial spaces 111 may be filled with a combination of the first solid material and the second solid material. In additional embodiments, the interstitial spaces 111 may comprise empty voids within the sintered nanoparticle-enhanced polycrystalline compact 102B in which there is no solid or liquid substance (although a gas, such as air, may be present in the voids). Such empty voids may be formed by removing (e.g., leaching) solid material out from the interstitial spaces 111 after forming the sintered nanoparticle-enhanced polycrystalline compact 102B. In yet further embodiments, the interstitial spaces 111 may be at least partially filled with a solid substance in one or more regions of the sintered nanoparticle-enhanced polycrystalline compact 102B, while the interstitial spaces 111 in one or more other regions of the sintered nanoparticle-enhanced polycrystalline compact 102B comprise empty voids.

Figure 3:
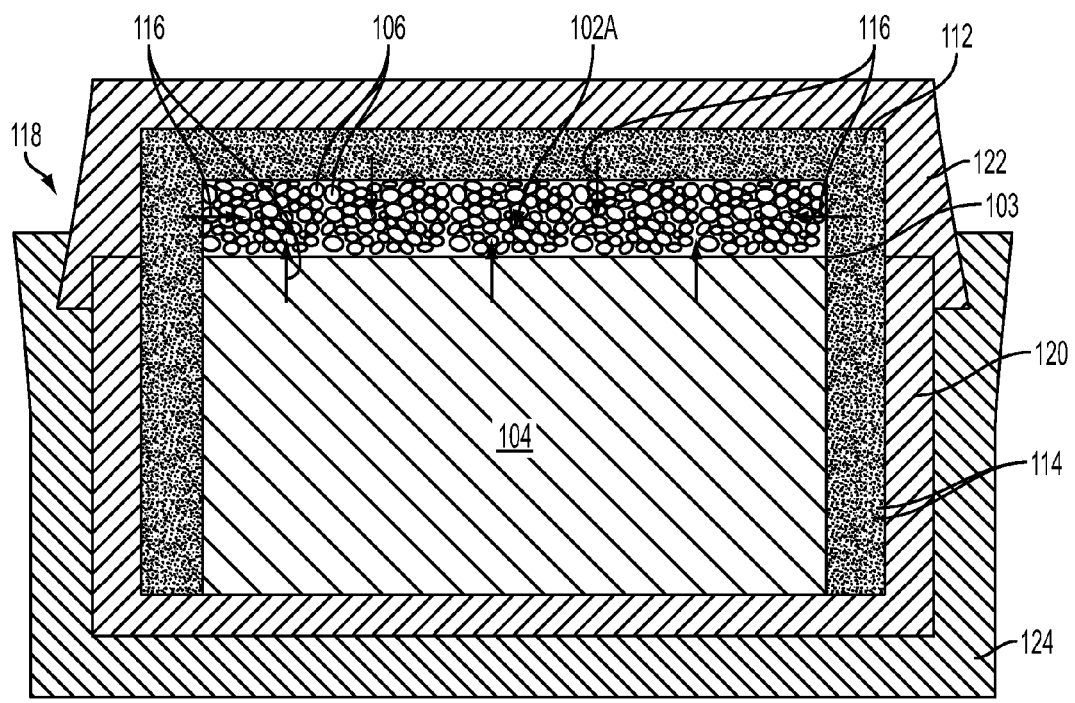
FIG. 3 is a simplified cross-sectional view of a configuration that may be used in a method of forming the cutting element of FIG. 1, in accordance with an embodiment of the disclosure.

An embodiment of the disclosure will now be described with reference to FIG. 3, which illustrates a simplified cross-sectional view of a configuration that may be used in a method of forming the cutting element 100 (FIG. 1). A volume of diamond particles 102A may be provided on a supporting substrate 104 within a canister 118. The diamond particles may include diamond nanoparticles, and the diamond particles may ultimately form the grains 106, 108 (FIG. 2) of diamond in a resulting nanoparticle-enhanced polycrystalline compact 102B (FIG. 2) to be formed by sintering the diamond particles 102A, as disclosed hereinbelow. A catalyst-containing layer 112 may be provided adjacent the volume of diamond particles 102A, as shown in FIG. 3. In some embodiments, the catalyst-containing layer 112 may also extend over one or more surfaces of the substrate 104.

As shown in FIG. 3, the canister 118 may encapsulate the diamond particles 102A, the supporting substrate 104, and the catalyst-containing layer 112. The canister may include an inner cup 120, in which at least a portion of each of the diamond particles 102A, the supporting substrate 104, and the catalyst-containing layer 112 may each be disposed. The canister 118 may further include a top end piece 122 and a bottom end piece 124, which may be assembled and bonded together (e.g., swage bonded) around the inner cup 120 with the diamond particles 102A, the supporting substrate 104, and the catalyst-containing layer 112 therein. The sealed canister 118 then may be subjected to an HTHP process to sinter the diamond particles 102A and form the nanoparticle-enhanced polycrystalline compact 102B of the cutting element 100 (FIG. 1).

The supporting substrate 104 may include a material that is relatively hard and resistant to wear. By way of non-limiting example, the supporting substrate 104 may include a cemented carbide material, such as a cemented tungsten carbide material, in which tungsten carbide particles are cemented together in a metallic binder material. The metallic binder material may include, for example, catalyst material such as cobalt, nickel, iron, or alloys and mixtures thereof. The metallic binder material may be capable of catalyzing inter-granular bonds between the diamond particles 102A, as described in further detail below. In at least some embodiments, the supporting substrate 104 includes a cobalt-cemented tungsten carbide material.

The catalyst-containing layer 112 may include plurality of particles 114 comprising a catalyst material. The catalyst material may be any material capable of catalyzing inter-granular bonds between the unbonded nanoparticles and the inter-bonded larger grains 106 in the diamond particles 102A. As non-limiting examples, the catalyst material may comprise one or more of silicon, cobalt, iron, nickel, or an alloy or mixture thereof. By way of non-limiting example, the catalyst-containing layer 112 may comprise a layer of cobalt-cemented tungsten carbide particles, or a substantially solid layer of cobalt-cemented tungsten carbide material. The catalyst material in the catalyst-containing layer 112 may be the same as or different than a catalyst (e.g., cobalt or a cobalt alloy) in the supporting substrate 104. By way of non-limiting example, the catalyst material in the catalyst-containing layer 112 may be Ni, and the catalyst material in the substrate 104 may be Co. The catalyst-containing layer 112 may, optionally, also include a non-diamond carbon material such as graphite. The non-diamond carbon material may increase the amount of catalyst material that infiltrates or permeates the diamond particles 102A during HTHP processing (e.g., sintering) by pre-saturating the catalyst material with carbon.

With continued reference to FIG. 3, during subsequent HTHP processing, the catalyst material of the catalyst-containing layer 112 and catalyst material in the supporting substrate 104 may infiltrate or permeate the diamond particles 102A in the directions represented by directional arrows 116 in FIG. 3. The HTHP processing may enable inter-granular bonding between the unbonded diamond particles 102A to form the sintered nanoparticle-enhanced polycrystalline compact 102B (FIG. 1) including the inter-bonded smaller grains 108 (FIG. 2) and larger grains 106.

The presence of the nanoparticles in the unbonded diamond particles 102A may impede the infiltration of catalyst material through an entirety of the unbonded diamond particles 102A solely from the substrate 104 in an HTHP process. Thus, in an effort to allow adequate infiltration of catalyst material through the entirety of the volume of the unbonded diamond particles 102A, the catalyst-containing layer 112 is provided adjacent the volume of the diamond particles 102A on one or more sides thereof that are not adjacent the substrate 104 so as to alloy catalyst to infiltrate into the diamond particles 102A from more than one side of the volume of diamond particles 102A.

Another embodiment of the disclosure will now be described with reference to FIG. 4, which illustrates a simplified cross-sectional view of a configuration that may be used in method of forming the cutting element 100 (FIG. 1). Diamond particles 102A may be provided on supporting substrate 104 within the canister 118 (FIG. 3). A first catalyst-containing layer 126 may be provided on exposed surfaces of the diamond particles 102A and on at least a portion of exposed surfaces (e.g., exposed side surfaces) of the supporting substrate 104. A second catalyst-containing layer 128 may be provided on exposed surfaces of the first catalyst-containing layer 126 and on remaining exposed surfaces of the supporting substrate 104.

The second catalyst-containing layer 128 may be substantially similar to the catalyst-containing layer 112 (FIG. 3) described above. The first catalyst-containing layer 126 may be a solid layer, such as a film, sheet, or mesh. The first catalyst-containing layer 126 may include a catalyst material as described above that is capable of catalyzing inter-granular bonding between the unbonded diamond particles 102A. The catalyst material of the first catalyst-containing layer 126 may the same as or different than each of a catalyst material in the supporting substrate 104 and catalyst material of the second catalyst-containing layer 128. As shown in FIG. 4, the first catalyst-containing layer 126 may cover exposed surfaces of the volume of diamond particles 102A and may extend to cover a portion of exposed side surfaces of the supporting substrate 104 proximate the interface 103 of the diamond particles 102A and the supporting substrate 104. In additional embodiments, the first catalyst-containing layer 126 may cover more or less of the exposed surfaces of the supporting substrate 104. For example, the first catalyst-containing layer 126 may at least substantially cover the exposed side surfaces of the supporting substrate 104. In further embodiments, the first catalyst-containing layer 126 may cover more or less of the volume of diamond particles 102A. For example, at least a portion of side surfaces of the volume of diamond particles 102A may be left uncovered by the first catalyst-containing layer 126.

With continued reference to FIG. 4, during subsequent HTHP processing, the catalyst material of the first catalyst-containing layer 126, the catalyst material of the second catalyst-containing layer 128, and catalyst material (e.g., metal binder) in the supporting substrate 104 may infiltrate or permeate the diamond particles 102A as represented by directional arrows 116. The HTHP processing may enable inter-granular bonding between the diamond particles 102A to form the sintered nanoparticle-enhanced polycrystalline compact 102B (FIG. 1) including the inter-bonded smaller grains 108 (FIG. 2) and larger grains 106.

Yet another embodiment of the disclosure will now be described with reference to FIG. 5, which illustrates a simplified cross-sectional view of a configuration that may be used in method of forming the cutting element 100 (FIG. 1). Diamond particles 102A may be provided on supporting substrate 104 within the canister 118 (FIG. 3). A catalyst-containing layer 130 may be provided on exposed surfaces of the volume of diamond particles 102A and on at least a portion of exposed surfaces of the supporting substrate 104. A non-catalyst-containing layer 132 may, optionally, be provided on remaining exposed surfaces (e.g., exposed side surfaces) of the supporting substrate 104.

The catalyst-containing layer 130 may be substantially similar to the first catalyst-containing layer 126 (FIG. 4) described above. The non-catalyst-containing layer 132, if provided, may be a solid non-particulate layer, such as a film, sheet, or mesh. The non-catalyst-containing layer 132 may include a non-catalyst material, such as carbides, ceramics, oxides, intermetallics, clays, minerals, glasses, elemental constituents, and various forms of carbon (e.g., carbon nanotubes, fullerenes, adamantanes, graphene, and amorphous carbon). A thickness of the non-catalyst-containing layer 132 may be substantially the same as a thickness of the catalyst-containing layer 130. As shown in FIG. 5, the non-catalyst-containing layer 132 may cover a portion of exposed side surfaces of the supporting substrate 104 not covered by the catalyst-containing layer 130. In additional embodiments, the non-catalyst-containing layer 132 may cover more or less of the exposed surfaces of the supporting substrate 104. For example, the non-catalyst-containing layer 132 may at least substantially cover the exposed side surfaces of the supporting substrate 104 (e.g., when the catalyst-containing layer 130 covers less of the exposed side surfaces of the supporting substrate 104, or when the catalyst-containing layer 130 covers no portion of the exposed side surfaces of the supporting substrate 104). In further embodiments, the non-catalyst-containing layer 132 may cover at least a portion of the volume of diamond particles 102A.

Figure 5:
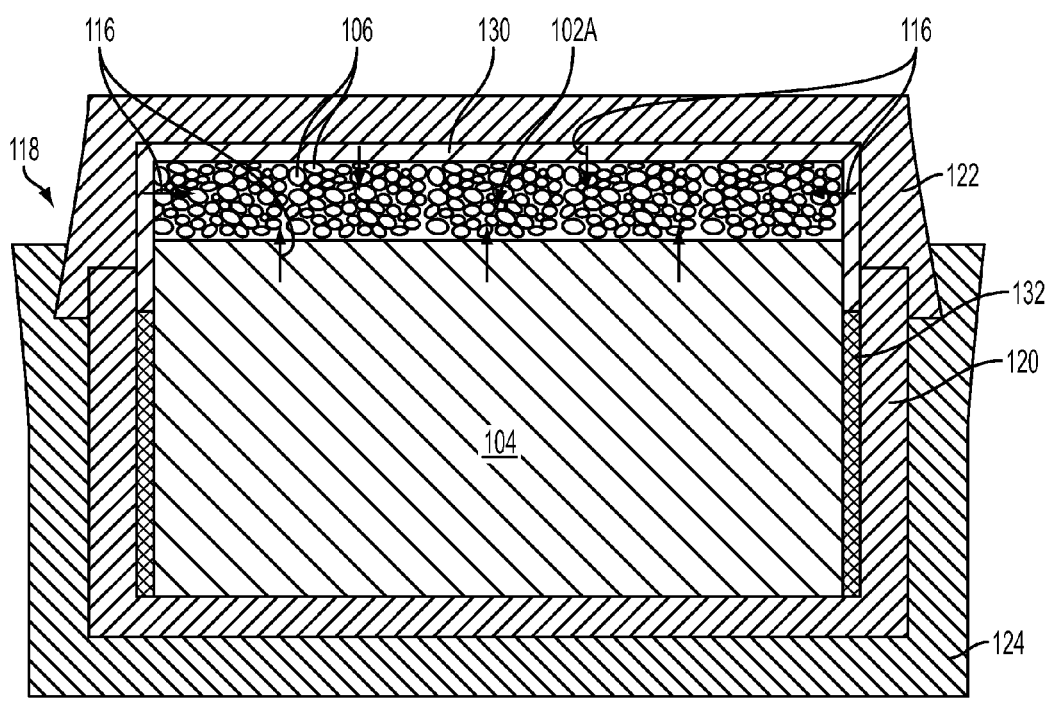
FIG. 5 is a simplified cross-sectional view of a configuration that may be used in a method of forming the cutting element of FIG. 1, in accordance with yet another embodiment of the disclosure.

With continued reference to FIG. 5, during subsequent HTHP processing, catalyst material of the catalyst-containing layer 130 and catalyst material in the supporting substrate 104 may infiltrate or permeate the diamond particles 102A as represented by directional arrows 116. The HTHP processing may enable inter-granular bonding between the diamond particles 102A to form the sintered nanoparticle-enhanced polycrystalline compact 102B (FIG. 1) including the inter-bonded smaller grains 108 (FIG. 2) and larger grains 106.

In additional embodiments, the diamond particles 102A may be replaced with previously formed nanoparticle-enhanced polycrystalline compact (similar to the compact 102B) in which catalyst material has previously been removed (e.g., leached) from interstitial spaces between the diamond grains therein, and which is desired to be bonded to the substrate 104 in an HTHP process. Such processes are often referred to in the art as "re-attach" processes.

Figure 6:
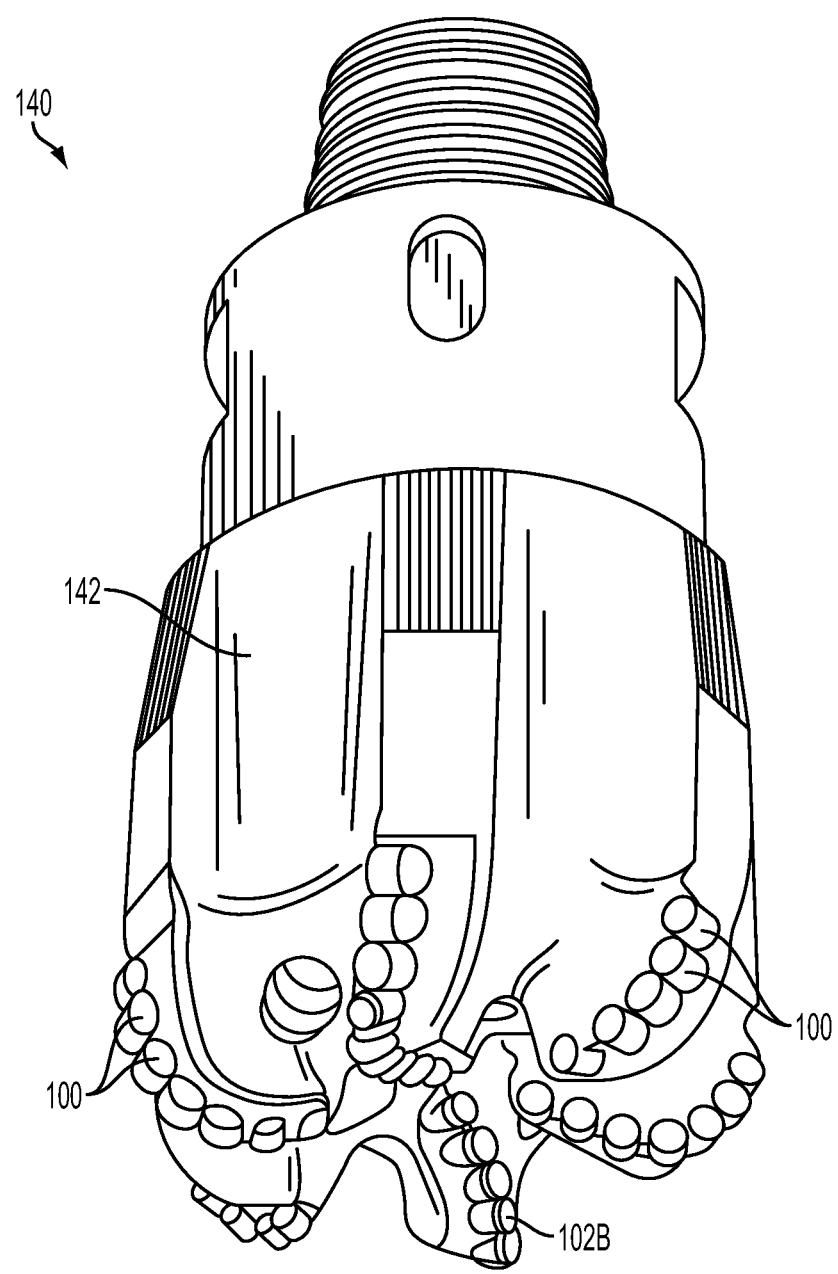
FIG. 6 is a perspective view of an embodiment of a fixed-cutter earth-boring rotary drill bit including cutting elements such as that shown in FIG. 1.

Embodiments of cutting elements 100 (FIG. 1) that include sintered nanoparticle-enhanced polycrystalline compact 102B (FIG. 1) as described herein may be secured to an earth-boring tool and used to remove subterranean formation material in accordance with additional embodiments of the present. The earth-boring tool may, for example, be a rotary drill bit, a percussion bit, a coring bit, an eccentric bit, a reamer tool, a milling tool, etc. As a non-limiting example, FIG. 6 illustrates a fixed-cutter type earth-boring rotary drill bit 140 that includes a plurality of cutting elements 100 (FIG. 1), each of which includes a sintered nanoparticle-enhanced polycrystalline compact 102B (FIG. 1), as previously described herein. The rotary drill bit 140 includes a bit body 142, and the cutting elements 100, which include the sintered nanoparticle-enhanced polycrystalline compact 102B, are bonded to the bit body 142. The cutting elements 100 may be brazed, welded, or otherwise secured, within pockets formed in the outer surface of the bit body 142.

Advantageously, as compared to previously known processes, the methods of the disclosure enable catalyst material to infiltrate or permeate a larger volume of diamond particles 102A that include diamond nanoparticles during HTHP processing. As a result, the methods of the disclosure may be used to form cutting elements 100 including sintered nanoparticle-enhanced polycrystalline compacts 102B more rapidly and uniformly, improving production efficiency and increasing the quality of the cutting elements 100 produced.

While the disclosure has been described herein with respect to certain example embodiments, those of ordinary skill in the art will recognize and appreciate that it is not so limited. Rather, many additions, deletions and modifications to the embodiments described herein may be made without departing from the scope of the invention as hereinafter claimed. In addition, features from one embodiment may be combined with features of another embodiment while still being encompassed within the scope of the invention as contemplated by the inventor. Further, the invention has utility in drill bits having different bit profiles as well as different cutter types.

What is claimed is:
1. A method of forming an earth-boring tool, comprising:
 depositing a diamond material comprising diamond nanoparticles on a supporting substrate;
 forming a catalyst-containing material discrete from the diamond material on each of a top and sides of the diamond material after depositing the diamond material on the supporting substrate;

processing the diamond material under high temperature and high pressure conditions to form a sintered nanoparticle-enhanced polycrystalline compact; and attaching the sintered nanoparticle-enhanced polycrystalline compact to a bit body.

2. The method of claim 1, further comprising selecting the catalyst-containing material to comprise at least one catalyst material different than at least one other catalyst material of the supporting substrate.

3. The method of claim 2, wherein selecting the catalyst-containing material to comprise at least one catalyst material different than at least one other catalyst material of the supporting substrate comprises:

selecting the at least one catalyst material to comprise one or more of cobalt, iron, and nickel; and selecting the at least one other catalyst material of the supporting substrate to comprise one or more of cobalt, iron, and nickel.

4. The method of claim 1, wherein attaching the sintered nanoparticle-enhanced polycrystalline compact to a bit body comprises securing the supporting substrate within a pocket in an outer surface of the bit body.

5. A method of forming an earth-boring tool, comprising:

depositing a diamond material on a supporting substrate, the diamond material comprising diamond nanoparticles;

depositing a catalyst-containing material on exposed surfaces of the diamond material and on a portion of exposed side surfaces of the supporting substrate;

providing another catalyst-containing material on the catalyst-containing material and on remaining portions of the exposed side surfaces of the supporting substrate;

subjecting the diamond material, the catalyst-containing material, the another catalyst-containing material, and the supporting substrate to high temperature and high pressure conditions to form a cutting element comprising a sintered nanoparticle-enhanced polycrystalline compact; and attaching the cutting element to a bit body.

6. A method of forming an earth-boring tool, comprising:

depositing a diamond material on a supporting substrate, the diamond material comprising diamond nanoparticles;

depositing a catalyst-containing material on exposed surfaces of the diamond material and on a portion of exposed side surfaces of the supporting substrate;

providing a non-catalyst-containing material on remaining portions of the exposed side surfaces of the supporting substrate;

subjecting the diamond material, the catalyst-containing material, the non-catalyst-containing material, and the supporting substrate to high temperature and high pressure conditions to form a cutting element comprising a sintered nanoparticle-enhanced polycrystalline compact; and attaching the cutting element to a bit body.

7. The method of claim 6, further comprising selecting the non-catalyst-containing material to comprise one or more of a ceramic, a carbide, an oxide, an intermetallic, a clay, a mineral, a glass, carbon nanotubes, fullerene, adamantane, graphene, and amorphous carbon.

* * * * *